United States Patent
Lauritzen et al.

(10) Patent No.: US 7,142,145 B1
(45) Date of Patent: Nov. 28, 2006

(54) ANALOG-TO-DIGITAL CONVERTER

(75) Inventors: Keir C. Lauritzen, Odenton, MD (US); Martin Peckerar, Sliver Spring, MD (US); Frank K. Perkins, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/997,092

(22) Filed: Nov. 23, 2004

(51) Int. Cl.
*H03M 1/12* (2006.01)

(52) U.S. Cl. .................................. 341/155

(58) Field of Classification Search ............... 341/155, 341/156, 120, 139, 159, 158, 161; 327/57, 327/65, 89; 395/400, 425, 162, 164
See application file for complete search history.

(56) References Cited

U.S. PATENT DOCUMENTS

| | | | | |
|---|---|---|---|---|
| 4,297,679 A | | 10/1981 | Arbel et al. ................. | 340/347 |
| 5,039,978 A | * | 8/1991 | Kronberg ................ | 340/815.45 |
| 5,471,210 A | | 11/1995 | Wingender et al. .......... | 341/156 |
| 5,706,008 A | | 1/1998 | Huntley, Jr. et al. ........ | 341/156 |
| 5,748,133 A | * | 5/1998 | Distinti ........................ | 341/161 |
| 6,459,400 B1 | | 10/2002 | Steinbach ................... | 341/156 |
| 6,664,910 B1 | | 12/2003 | Mulder et al. .............. | 341/158 |
| 6,762,708 B1 | | 7/2004 | Sutardja ...................... | 341/155 |
| 2004/0085236 A1 | | 5/2004 | Yoon ............................ | 341/160 |

OTHER PUBLICATIONS

Lampinen et al. "A New Dual-Mode Data Compressing A/D Converter" 1997 IEEE International Symp. Jun. 1997.
Mahmoud et al. "A non linear A/D converter for smart silicon sensors" Delft Univ. of Tech. IEEE No. 0-7803-0593, 1992, no month.
Lygouras "Non linear ADC with digitally selectable quantizing characteristic" IEEE Trans. On Nuclear Science, vol. 35, No. 5, Oct. 1988.

* cited by examiner

*Primary Examiner*—Brian Young
(74) *Attorney, Agent, or Firm*—John J. Karasek; Sally A. Ferrett

(57) ABSTRACT

An analog to digital converter circuit includes an isolation circuit, an input circuit including a resistor chain, a plurality of fixed threshold comparators, and an encoder. The resistor chain includes a plurality of resistors connected in series, the isolation circuit being configured to isolate a device supplying the analog input signal from the input circuit. The isolation circuit is connected to the input circuit at a top node of the resistor chain, and wherein $2^N$ values of the analog input voltage are connected to inputs of the fixed threshold comparators to produce corresponding output signals. Methods of converting an analog signal to a digital signal are also described.

20 Claims, 16 Drawing Sheets

ANALOG-TO-DIGITAL CONVERTER

TECHNICAL FIELD

Aspects of the invention generally relate to analog-to-digital converter apparatuses and methods for converting analog signals to digital signals. More specifically, aspects of the invention relate to flash A/D converter apparatuses and methods.

BACKGROUND OF THE INVENTION

Analog-to-digital converters are necessary to take the "real" analog world into the digital world. Real world responses are typically not always linear. Most often, the response signal may have to be manipulated before it can be utilized. A common manipulation technique for such manipulation is compression. Compression is an important type of signal processing and is used not only to increase the dynamic range but also linearize many exponential-like functions.

Compression increases the dynamic range of signals and if followed by decompression (e.g., companding) can raise the signal-to-noise (SNR) ratio. Compression can be performed in the analog domain using log amplifiers, as illustrated in FIG. 1, or in the digital domain as part of a digital signal processing (DSP) routine. In one exemplary approach, compressing A/D converters have been implemented using a successive-approximation technique with sampling rates of 4.5 Ms/second.

FIG. 1 shows a typical signal processing system 100 wherein A/D conversion can be performed in the analog domain using log amplifiers or in the digital domain as part of a digital signal processing (DSP) routine. The system 100 includes a sampler 102, an analog preprocessor 102, an analog-to-digital converter (ADC) 106, a digital signal processor (DSP) 108, and a communications/storage device 110.

The sampler 102 is configured to sample an analog input signal. The analog preprocessor 104 is configured to pre-process the sampled analog input signal. The ADC 106 is configured to convert an analog signal to a digital signal. The DSP 108 is configured to further process the digital signal. The communications/storage device 110 is configured to store and/or transmit the digital signal.

FIG. 2 is a schematic of a standard parallel Flash A/D converter 200. It is well known that flash A/D conversion is one of the most basic types of analog to digital conversion techniques. The Flash A/D converter 200 includes an input buffer 201, a plurality of comparators 202, a resistor ladder network 204, and an encoder 206. An input signal $V_{in}$ is connected, via the input buffer 201, to the non-inverting inputs of $2^N-1$ parallel comparators. The inverting inputs of the respective comparators 202 are connected to an equal number of discrete reference voltages generated by the resistive ladder 204. Comparators 202 produce a logic "0" or "1" depending on whether the input voltage is lower or higher than the reference voltage. The comparators 202 produce an output of "thermometer" code (e.g., 0 . . . 01 . . . 1). The output of the comparators 202 are connected to the encoder 206 which produces a binary output depending upon where the ". . . 01 . . . " transition is.

Various approaches exist for achieving compression in the signal processing chain, carried out as either analog compression or digital compression. Logarithmic amplifiers are commercially available which can perform the desired analog pre-processing. Logarithmic amplifiers are typically monolithic devices that have high power consumption (e.g., 25 mW) and DSP logic is intensive, leading to a large part count and excessive power dissipation. These devices are therefore not desirable for some applications, particularly silicon-on-chip (SoC) technologies. Besides logarithmic amplifiers, other analog pre-processors can achieve similar results, for example through the use of integrator and differentiator functionalities built from op-amp circuits. However, like most analog processors, these having high power consumption and are difficult to integrate on a chip.

Digital signal processing (DSP) can perform similar functions performed by analog processors. There are, however, problems associated with this approach. One of the goals of compression is to minimize the required resolution and consequently increase the available bandwidth of the A/D conversion process. In typical flash AND converters, since digital processing occurs after the conversion, such benefit of increasing the available bandwidth is eliminated. Further, DSP typically requires dedicated hardware, thus eliminating the goal of SoC integration. DSP also consumes high dynamic power and is mathematically intensive, leading to complex programming and lengthy application development cycles.

Most sensor applications require analog preprocessing followed by analog to digital conversion. Analog preprocessing tends to dissipate large amounts of power, uses a large die area, and can be difficult to execute in CMOS technology, for example, due to non-linearities resulting from process variations. Analog preprocessing typically involves amplification to rescale signals from low-level sensor or transimpedance amplifier outputs to be on the order of voltage rails for high resolution conversion at the risk of saturation. Signal-level compression is often desired to allow for a greater dynamic range. This processing is usually followed by ADC, for data transmission, storage or further processing. ADC is typically power-intensive and bandwidth limiting.

Accordingly, there is a need to overcome the above-identified problems.

SUMMARY OF THE INVENTION

Aspects of the invention include an analog to digital converter circuit that includes an isolation circuit, an input circuit including a resistor chain, a plurality of fixed threshold comparators, and an encoder. The resistor chain includes a plurality of resistors connected in series. The isolation circuit is configured to isolate a device supplying the analog input signal from the input circuit. The isolation circuit is connected to the input circuit at an uppermost node of the resistor chain, and wherein $2^N$ values of the analog input voltage are connected to inputs of the fixed threshold comparators to produce corresponding output signals.

In some embodiments, a method of converting an analog signal to a digital signal includes receiving an analog input signal, compressing the analog input signal, and converting the compressed analog input signal to a digital signal, wherein compression of the analog input signal and conversion of the compressed analog input signal to a digital signal are simultaneously performed in a single step.

In other embodiments, an apparatus for converting an analog signal to a digital signal includes means for receiving an analog input signal, means for compressing the analog input signal, and means for converting the compressed analog input signal to a digital signal, wherein the compressing and the converting are simultaneously performed in a single step.

In another aspect, a flash analog to digital converter circuit includes an input buffer configured as a common drain amplifier biased with a current, a resistive ladder having a plurality of resistors, a plurality of fixed threshold comparators, and an encoder. The input buffer is configured to isolate the resistive ladder from an analog input signal. The input buffer is connected to the resistive ladder at an uppermost node of the resistive ladder, and wherein $2^N$ values of the analog input signal are connected to inputs of the fixed threshold comparators to produce corresponding output signals. The analog input signal is provided via the input buffer in order to provide increased drive current to the resistive ladder to isolate the resistive ladder and minimize loading of a device supplying the analog input signal. Compression of the analog input signal and conversion of the compressed analog input signal to a digital representation are simultaneously performed.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
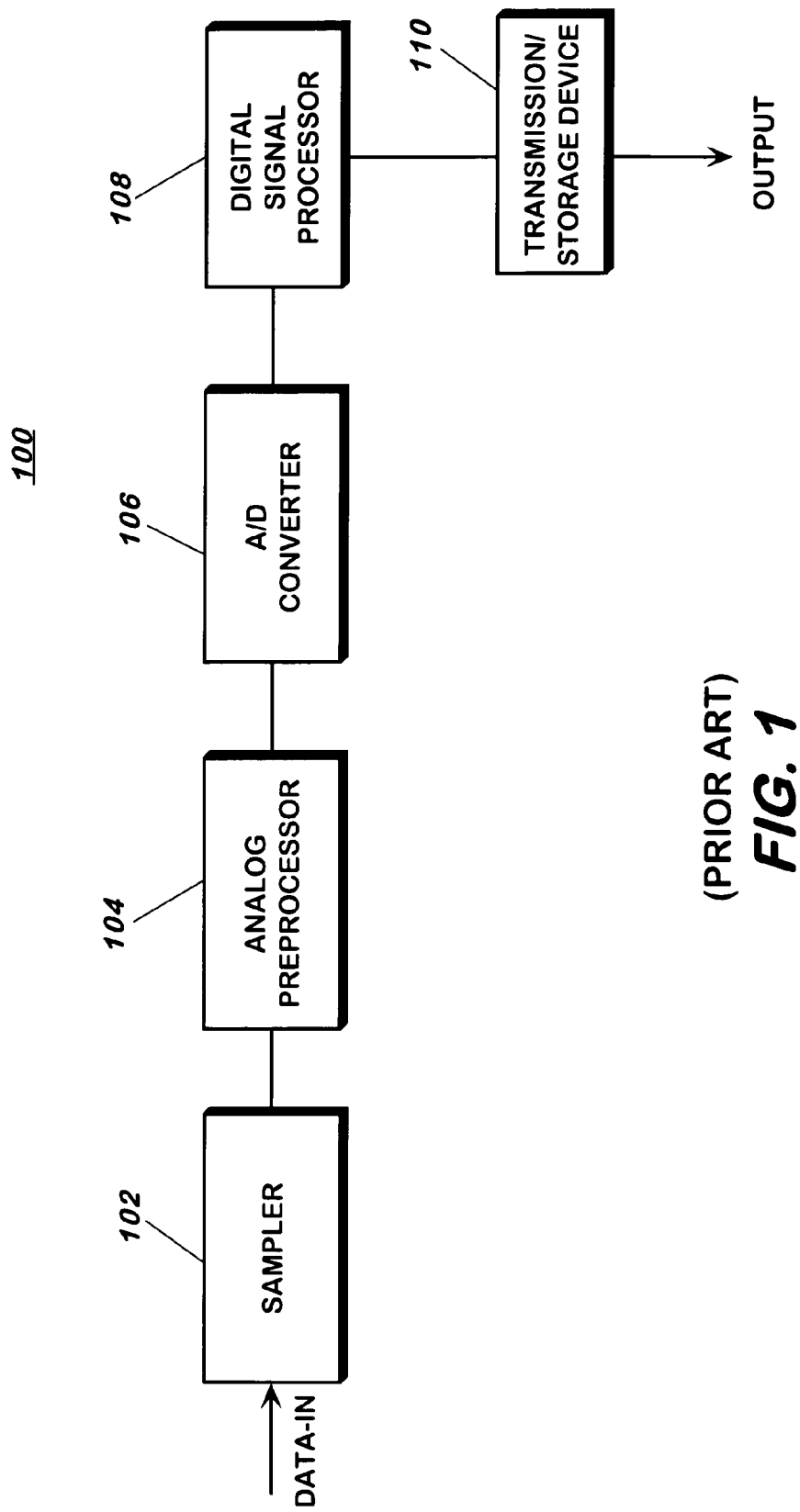
FIG. 1 is a schematic of a typical signal processing system.
Figure 2:
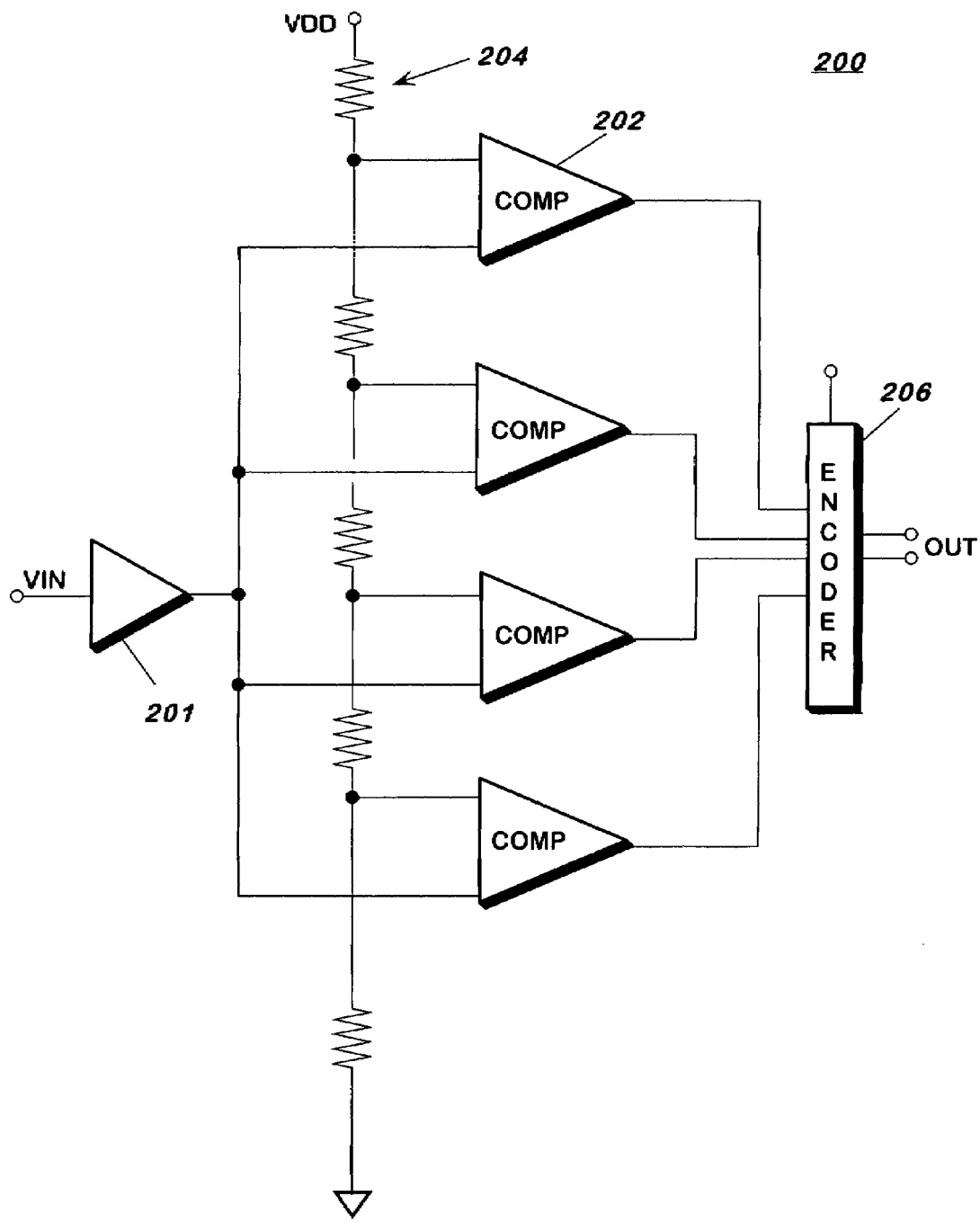
FIG. 2 is a circuit diagram of a standard parallel Flash A/D converter.
Figure 3:
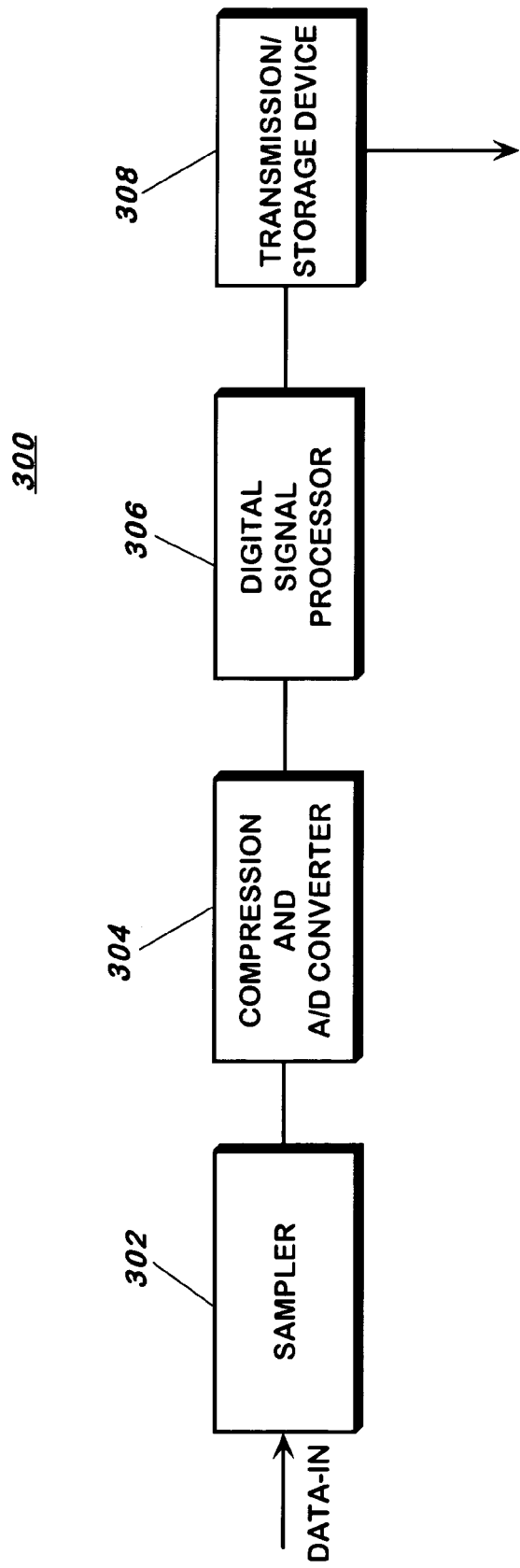
FIG. 3 is a schematic of a signal processing system implementing compression in accordance with an embodiment of the invention.

FIG. 3 is a schematic of signal processing system 300 in accordance with various embodiments of the invention. The system 300 includes a sampler 302, compression and analog-to-digital converter circuit 304, a digital signal processor (DSP) 306, and a communications/storage device 308. The sampler 302, the DSP 306, and the communications/storage device 308, respectively, are similar to the sampler 102, the DSP 108, the communications/storage device 110, respectively as shown in FIG. 1 and the description of such devices is therefore not repeated. In the embodiment shown in FIG. 3, analog preprocessing and digitization is combined into a single step wherein compression is performed simultaneously with the A/D conversion thereby allowing for compression at small design scales for a variety of sensor applications. The communications device 308 can be a broadcast system or a local or other type of network employing a variety of media such as, for example, radio frequency, optical communications device, etc. to transmit the digital signals converted from the analog signals by the ADC 304.

Figure 4:
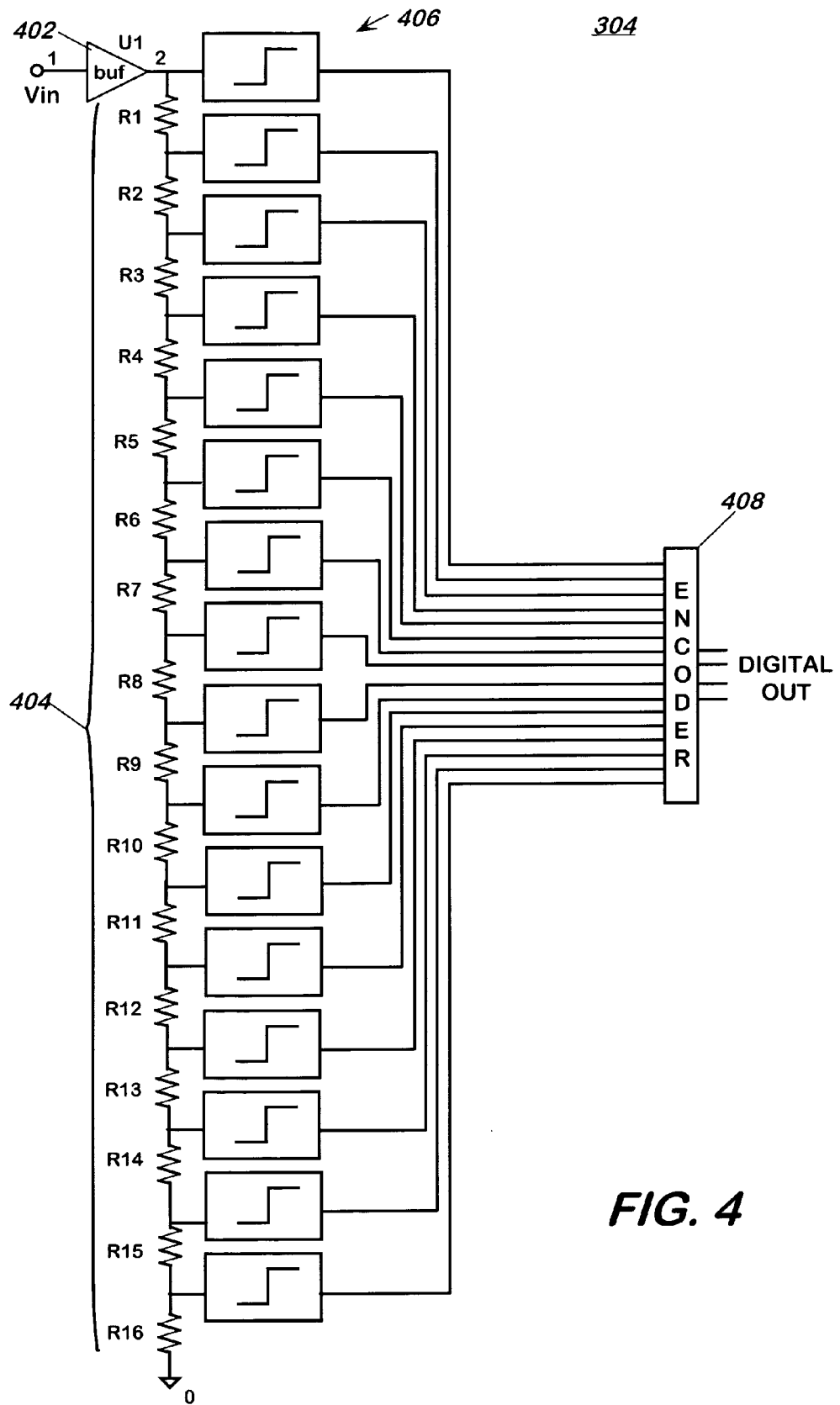
FIG. 4 is a block diagram of an example compressing A/D converter in accordance with some embodiments of the invention.

FIG. 4 is a schematic block diagram of a compressing A/D converter 304 shown in FIG. 3. A 4-bit compressing A/D converter is shown in FIG. 4 for purposes of illustration. Compressing A/D converters of other resolutions are possible. The A/D converter 304 includes an input buffer 402, a resistive ladder network 404, a plurality of comparators 406, and an encoder 408. The ladder network 304 is also referred to herein as a series resistor chain 404. The A/D converter 304 is non-linear and has an arbitrary compressing transfer function. The A/D converter performs amplification of the analog input signal before converting it to a digital signal. The resistive ladder network 404, the plurality of comparators 406, and the encoder 408 are collectively referred to herein as the input circuit.

An analog input signal $V_{in}$ is received by the input buffer 402 which isolates the input signal from a series resistor chain 404 (e.g., resistive ladder network). Providing the analog input signal to the resistor chain 404 via the input buffer 402 helps to minimize loading of a device supplying the analog input signal. The input buffer 402 is alternatively referred to herein as the isolation circuit 402. The input buffer 402 also sources current to the series resistor chain 404. The input buffer 402 can be, for example, a simple common drain amplifier. It will be appreciated that other buffers can be used with little influence over the final behavior of the A/D converter 304, so long as they were linear in response. The input buffer 402 can also play a dominant role in determining the response speed of the A/D converter 304. In one case, in order to increase the speed over the common drain amplifier, in the ADC 304, BiCMOS or Bipolar amplifiers could be used. In order to understand the voltage transfer characteristic (VTC) of the ADC 304, the buffer offset of the input buffer 402 need to be considered. The buffer 402 is preferred to be able to source current $I_{drive}$ given by:

$$I_{drive} = \frac{V_{cc}}{2^N \times R} \quad (1)$$

where $V_{cc}$ is the analog power level, and $2^N$ is the number of series resistors of resistance R in the resistive ladder 404, N being the number of bits prior to the encoder 408. The series resistor chain 404 is connected at one end to the output of the buffer 402 and the other end of the resistor chain 404 is connected to the ground, thereby dividing the buffered input voltage $V_{in}$ and the generated node voltages $V_n$ connected via $n=2^N$ resistors to ground. In other embodiments, the other end of the chain 404 can be connected to $-V_{in}$. The node voltages $V_n$ can be described by the following equation:

$$V_n = V_{in} \times \frac{2^N - n}{2^N} \qquad (2)$$

It is preferred that the resistor chain 404 use as spatially small resistors as possible in order to minimize die size. Such small resistors subsequently have low resistance values which can impose design constraints on the input buffer 402. The $2^N$ values of $V_n$ are connected to the inputs of $2^N$ comparators 406. In one embodiment, the comparators 406 can be fixed threshold comparators. When the voltage supplied to the comparators 406 is below a threshold value, the digital output of the ADC 304 (FIG. 4) is a logic 0, and when such voltage is above the comparator switching voltage (e.g., $V_{sw}$), the output is a logic 1. The comparators 406 can be designed in several ways, for example, using high gain differential amplifiers or CMOS inverters. By varying the resistance magnitudes from "rung to rung" in the series resistor chain 404, arbitrary compression function of the ADC 304 can be achieved. In an exemplary case, resistors of the series resistor chain 404 can be of equal value.

The signals output by the comparators 406 are received by the encoder 408 which then produces a digital output corresponding to the input voltage $V_{in}$. Further details of the comparators 406 are described with reference to FIG. 5.

Figure 5:
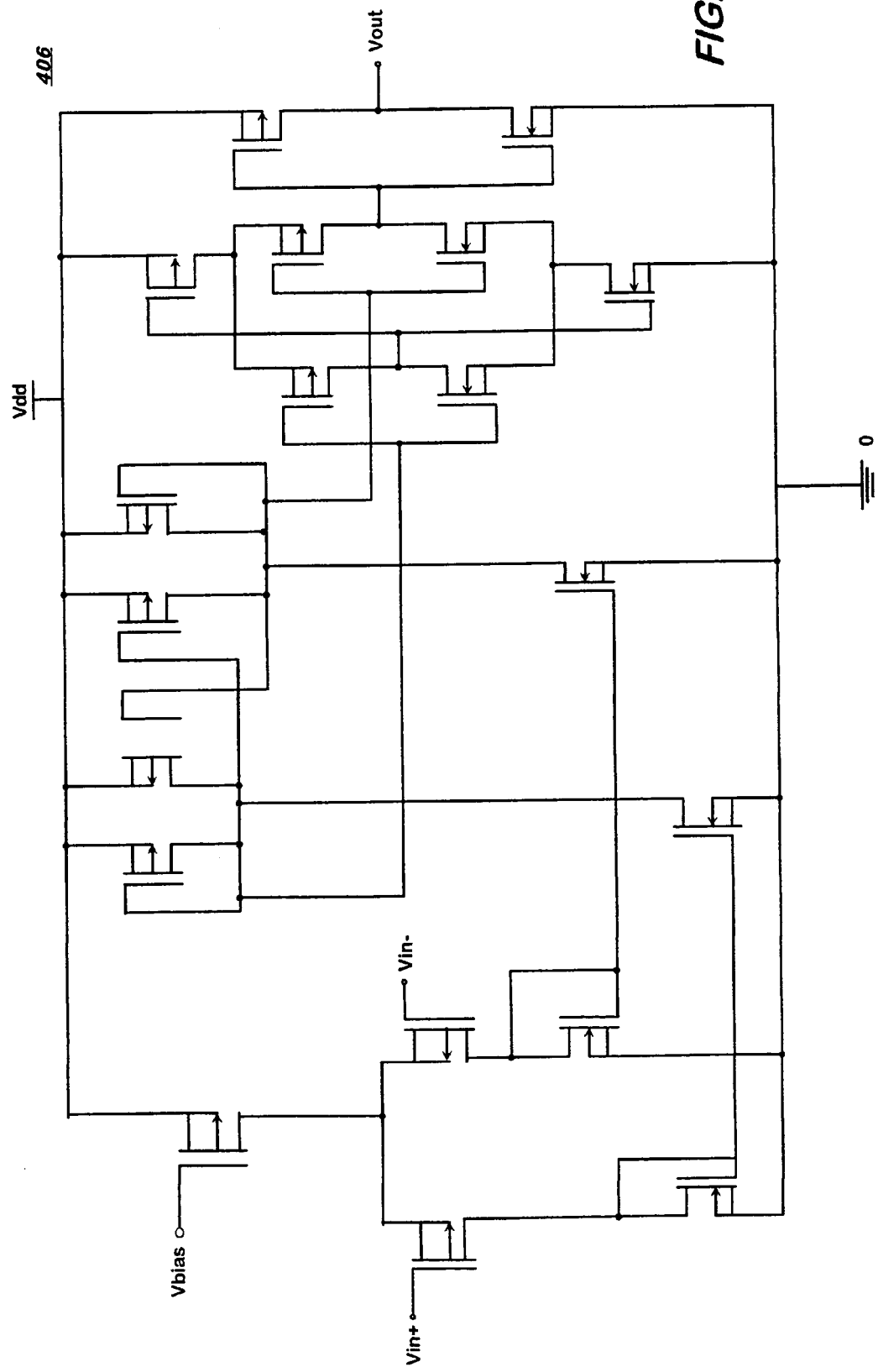
FIG. 5 is an exemplary circuit diagram of a comparator shown in FIG. 4.

FIG. 5 is an exemplary schematic circuit diagram of each of the comparators 406 shown in FIG. 4. Each comparator 406 includes a differential pair preamplifier, a PMOS decision circuit, a self-biasing differential amplifier, and a CMOS inverter. The decision circuit uses positive feedback to switch between two logic states based on the differential pair preamplifier. The CMOS inverter acts as a gain stage and also makes the output voltages CMOS compatible. Due to the low common-mode input voltage, careful attention maybe needed when biasing the circuit.

Figure 6:
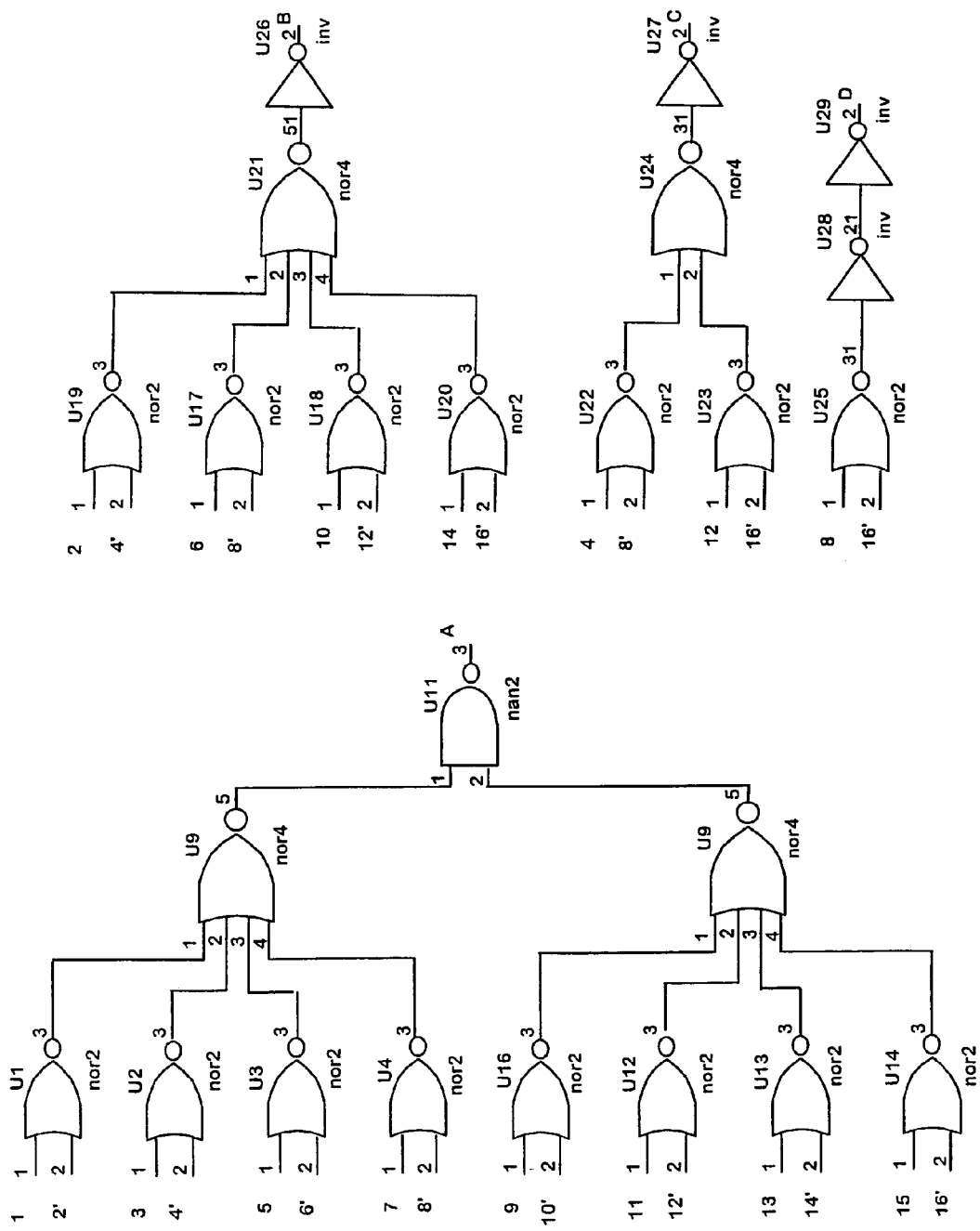
FIG. 6 is an exemplary circuit schematic of an encoder shown in FIG. 4.

FIG. 6 is an exemplary circuit schematic of the encoder 408 shown in FIG. 4 in accordance with various embodiments of the invention. The encoder 408 is of a minimum gate configuration designed using CMOS gates with four or less inputs. The encoder 408 includes an inverter ladder connected to every other comparator. A plurality of two input NOR gates, one gate per bit, connects to a combination of the inverted and non-inverted outputs. Each set of NOR gate outputs are connected to a larger NOR gate whose output is the output of the circuit. The output is in the form of a binary word in N parallel bits. The digital output is shown in FIG. 7.

Figure 7:
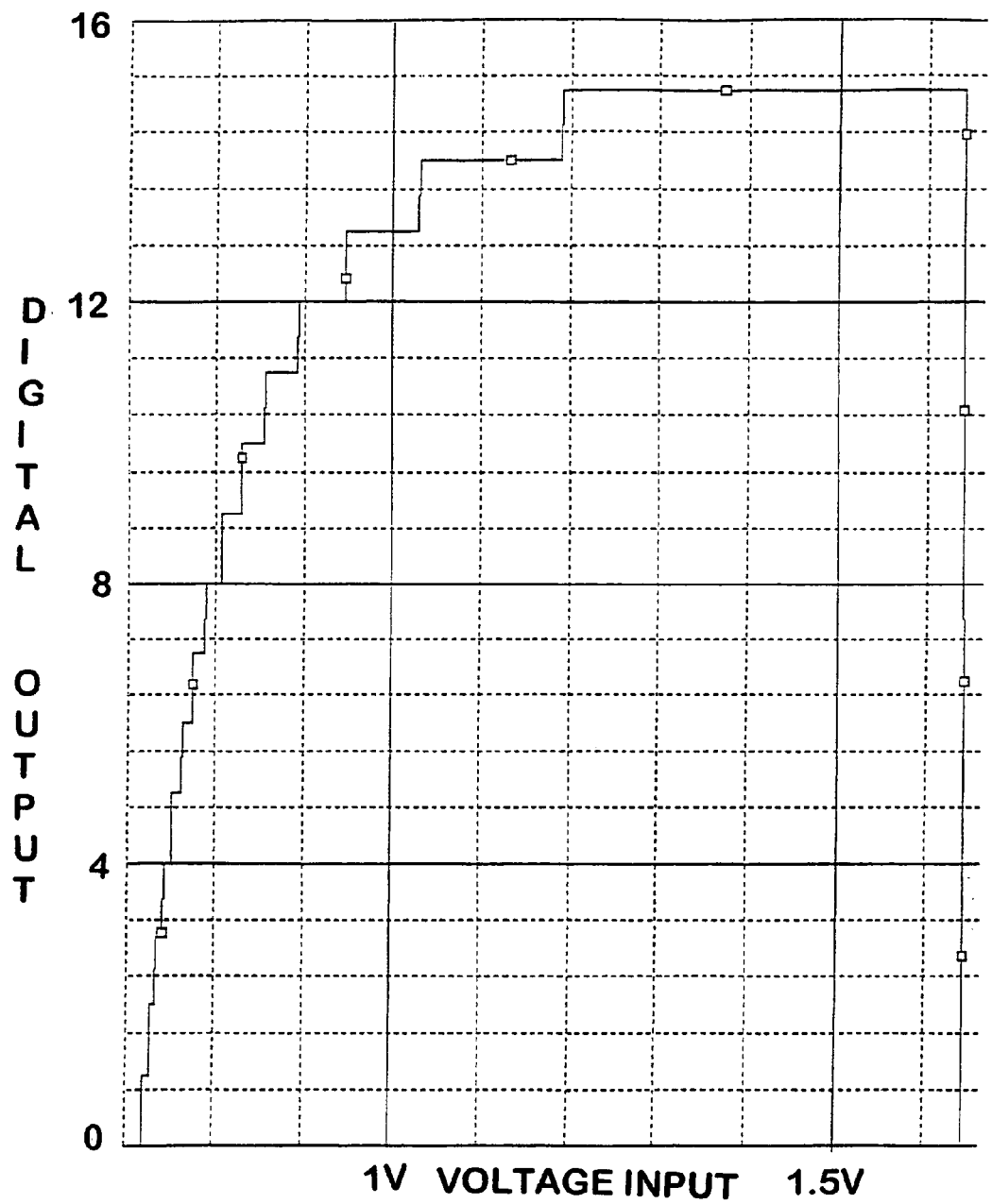
FIG. 7 is a plot of a transfer function, of a compressing A/D converter shown in FIG. 4 and obtained from simulation results.
Figure 8:
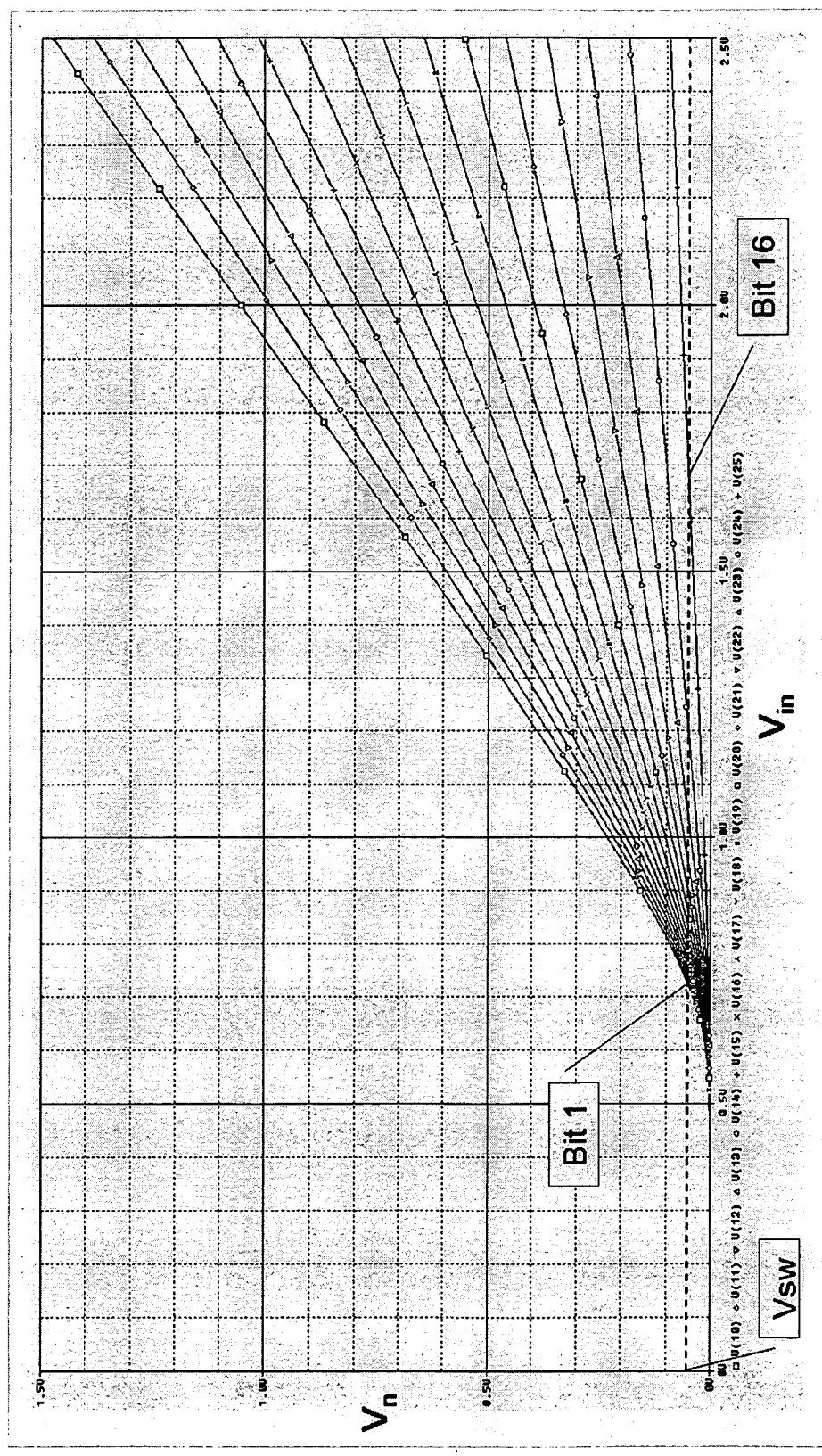
FIG. 8 is a plot of the node voltages of the resistors of the resistor chain of FIG. 4. With equal value resistances, the node voltages (Bit 1 and Bit 16) are shown to be evenly spaced.

FIG. 7 is a plot of a transfer function of the compressing A/D converter 304 as shown in FIG. 4, wherein input voltage is plotted on the x-axis and digital output is plotted on the y-axis. With equal value resistances for the resistors of the resistor chain 404 (FIG. 5), the node voltages $V_n$ are evenly spaced as shown in FIG. 8.

The output of the comparators 406 (FIG. 4) changes state when $V_n = V_{sw}$ so that when equation (1) is rearranged, the inventors have found that the digital output goes as $-1/V_{in}$:

$$\frac{V_{sw}}{V_{in}} = \frac{2^N - n}{2^N} = 1 - \frac{n}{2^N} \qquad (3)$$

$$\frac{n}{2^N} = 1 - \frac{V_{sw}}{V_{in}} \qquad (4)$$

Figure 9:
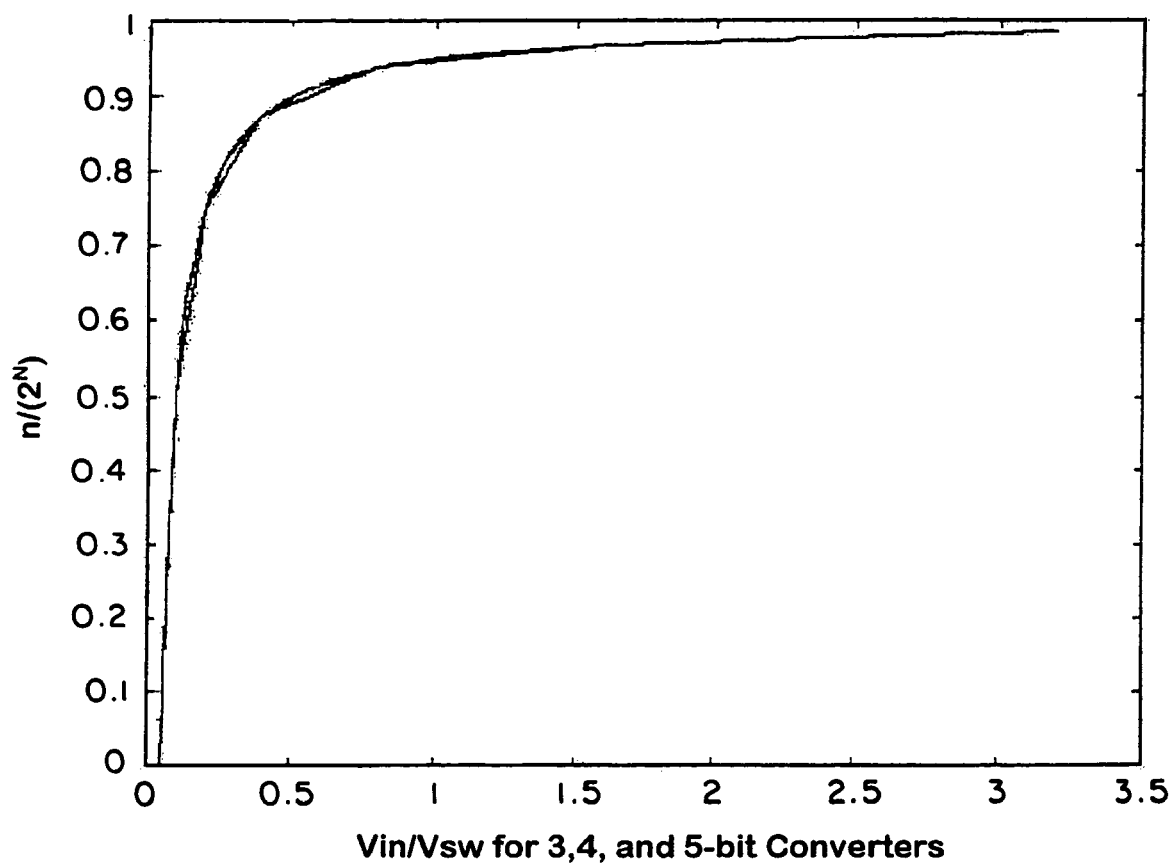
FIG. 9 is a plot of the output function, of the A/D converter shown in FIG. 4, for various values of "n" normalized to the number of stages $2^N$.

A plot of the function shown in equation (4) is shown in FIG. 9. From FIG. 9, the inventors have observed that if n is normalized to the number of stages ($2^N$), the general output of the curve of the ADC (e.g., ADC 304 of FIG. 4) would remain the same. Increasing the number of bits N can cause more transitions and make the digital output better fit the equivalent analog compression function.

Device Characteristics

Static and Dynamic Power Dissipation

The components to consider when calculating power dissipation include comparators (e.g., comparators 406), input buffer (e.g., buffer 402), the resistive ladder (e.g., resistive chain 404), and the encoder (e.g., encoder 408). Static power is defined herein as the power dissipated when the input signal is a fixed DC value and dynamic power is defined herein as the power dissipated when the input signal changes typically as a result of a step function. The comparators (e.g., comparators 406) and the buffer (e.g., buffer 402) are constant current devices and therefore need a constant power consumption that is comparable for static and dynamic conditions. The encoder 408 ideally would have a zero static power (into finite impedance). However, in some embodiments, since a given input voltage can cause the output of the comparators (e.g., comparators 406) to be a non-rail value due to the use of CMOS inverters. Such a non-rail value results in spikes in a graph representing device power versus $V_{in}$. It is preferable to ensure that the comparator output voltage swing is closer to the rails than the turn-on or turn-off levels of the encoder (e.g., encoder 408) to minimize static power consumption. Dynamic power of the ADC 304 is dominated by the encoder (e.g., encoder 408), which can typically be an order of magnitude high than the dynamic power of the comparators 406 and the buffer 402.

The resistive ladder 404 can have interesting consequences for the static power dissipation. The resistors in the resistive ladder 404 are preferred to be as small as possible while retaining accuracy. Such is preferred at least to increase transient performance and to reduce the die size. Since the resistors are kept small, the total resistance is kept low and therefore, power dissipation increases ($V^2R$). The increased power dissipation can cause the static power to be high for high input voltages and low for low input voltages, thereby allowing for an extremely low quiescent power dissipation. Quiescent power is defined herein as the static power with no input to the resistive ladder (e.g., resistive ladder 404).

The power dissipation of the ADC 304 has the potential to be much lower than conventional flash A/D converters since the resistor chain 404 can be "turned off" and since the ADC 304 needs fewer bits (and therefore a smaller encoder circuit) to cover the same dynamic range with a comparable small signal resolution (e.g., for AC coupled signals). The inventors have observed that low bit counts can result in lower overall power consumption.

Transient Performance

The transient characteristics of the ADC 304 are also comparable to conventional Flash A/D converters. In accordance with various embodiments of the invention, the input signal propagation down the resistive ladder 404 is determined by the RC ladder network rather than the pure parallel input capacitance of conventional Flash converters.

In some embodiments, the propagation delay of the ADC 304 is at least partially mitigated by the use of fixed threshold comparators (FTCs) for comparator 406. The FTCs allow for increased optimization of the comparators (e.g., comparators 406) for a given operating voltage, and the comparators (e.g., comparators 406) may not be required to operate from $V_{ss}$ to $V_{dd}$. A smaller defined range (e.g., 40 mV to about 100 mV may be sufficient. Such allows for techniques such as cascaded differential pairs and cascaded active loads, thereby enabling high speed and also implementation of high gain amplifiers. Fixed threshold comparators can also increase the potential use of other devices such as, for example, CMOS inverters as comparators, with similar benefit as single voltage stabilization. Since all of the reference voltages are similar, there are no common-mode considerations. Therefore, current mirrors can be simplified.

Simulation Results

In some embodiments, the topology of the ADC 304 can be implemented in all-CMOS. In an exemplary implementation, the inventors have designed the ADC 304 as a 4-bit converter and analyzed using PSpice modeling software. The simulations were done as a proof-of-concept and to confirm the basic analysis. In some embodiments, the comparators (e.g., comparators 406) used were simple differential pairs followed by a series of three CMOS inverters. The encoder (e.g., encoder 408) can be of a minimum-gate configuration developed using gates with less than four inputs. The buffer (e.g., input buffer 402) can be a basic common drain amplifier, and the resistors (e.g., resistors of chain 404) can be simple resistors with no assumed capacitance or inductance. The inventors found that this exemplary design requires about 367 transistors and 34 resistors. In this exemplary design, the resistors of resistor ladder 404 each have a resistance of about 500 ohms. TSMC MOSFET level 7 parameters were used, based on MOSIS measurements to model the transistors having a channel length of about 0.25 microns.

Figure 10:
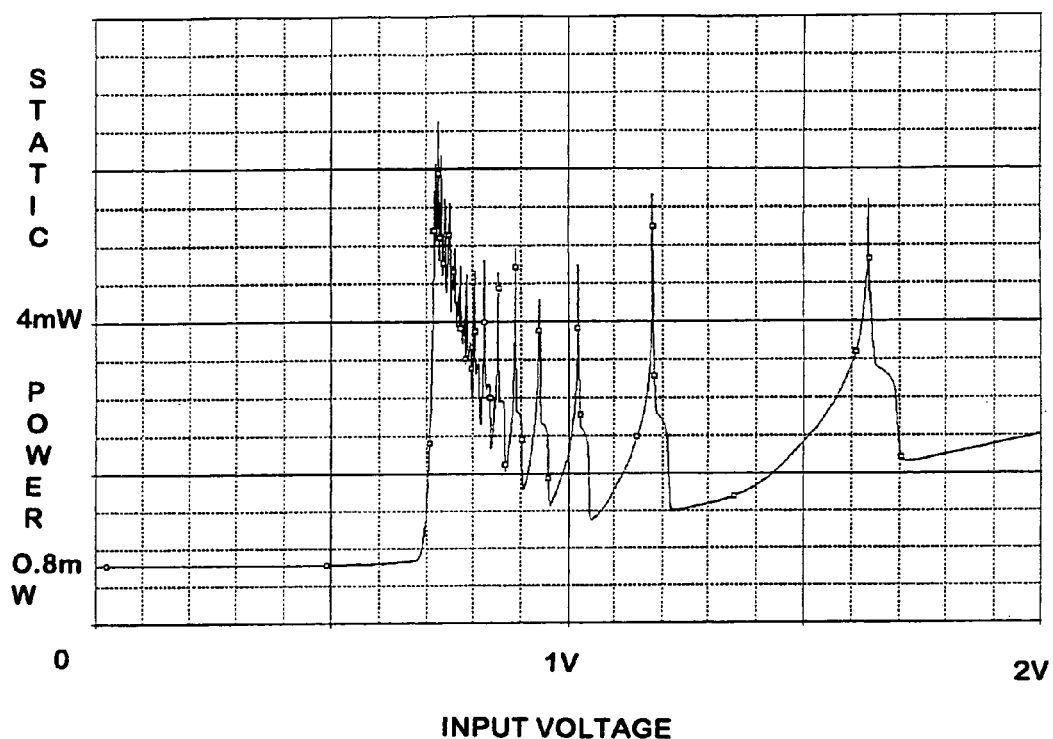
FIG. 10 is graph illustrating the static power dissipation of the A/D converter shown in FIG. 4.
Figure 11:
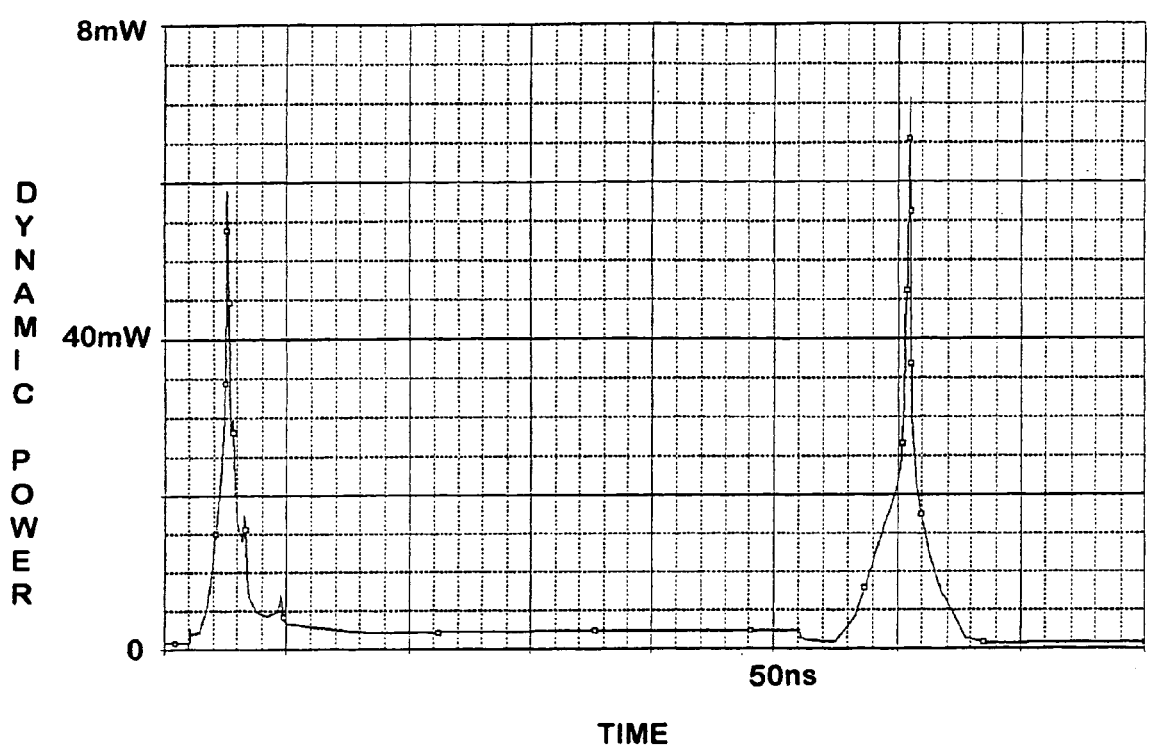
FIG. 11 is a graph illustrating the dynamic power dissipation of the A/D converter shown in FIG. 4.
Figure 12:
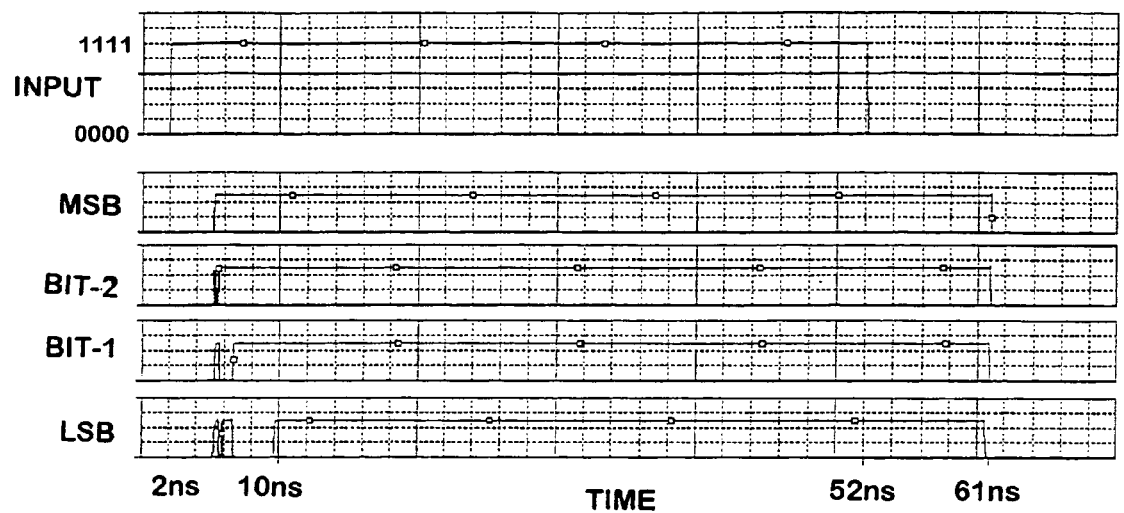
FIG. 12 is a graph illustrating the pulse response of the A/D converter shown in FIG. 4. The graph shows that the rise times are less than 8 ns and fall times are less than 10 ns.

The single power supply rail was set at 2.5 V. The useful input voltage range was observed to be 0.6 V to 1.3 V. The static power of the exemplary design is about 2.5 mW and the quiescent power is less than 1 mW as shown in FIG. 10. The plots illustrated in FIGS. 7 through 16 are plotted with $V_{sw}$=50 mV. The inventors have observed that the measured power values agree with the simulated results as noted above—the static power is low and depends upon the comparators, and the power is much lower when the input is low. The maximum response time of the ADC 304 was measured using a switch from "0000" to "1111" and shows all circuits turning on and using maximum power. The peak dynamic power was found to be just over 60 mW and average dynamic power at the maximum operating frequency of about 400 MHz was observed to be about 20 mW as shown in FIG. 11. The maximum response time was found to be less 10 ns as shown in FIG. 12 and is observed on the least significant bit (LSB). The circuit design for the simulation used low comparator currents to minimize power and therefore the speed was found to be lower. In other embodiments, a different optimization could have a relatively higher speed and due to similarities with parallel flash conversion, the capabilities of the device can track that of flash conversion.

Figure 13:
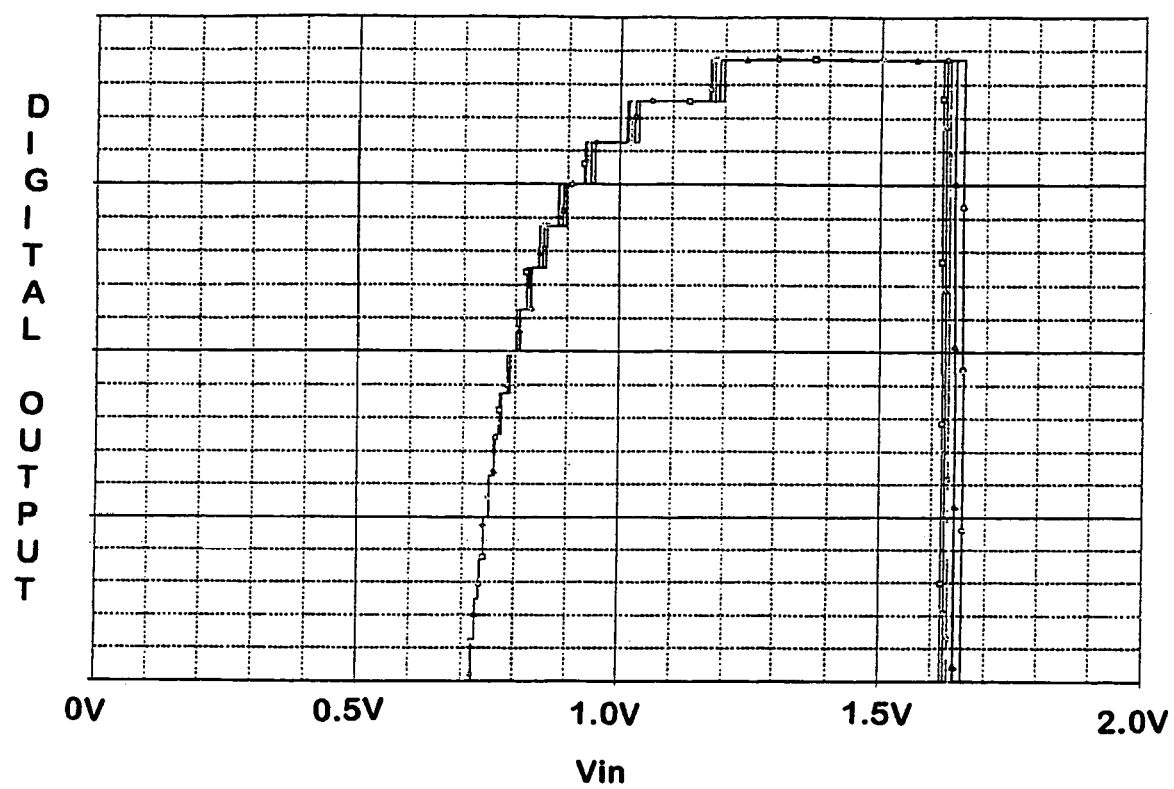
FIG. 13 is a graph showing digital output of the A/D converter of FIG. 4, the measurements being made at −20, 27, 55, and 85 degrees Celsius.

During simulation, the ADC 304 circuit showed good temperature stability, maintained linearity at various temperatures, and maintained similar transition voltages at such temperatures. The results plotted in FIG. 13 were generated with specified temperatures of −20, 27, 55, and 85 degrees Celsius. The linearity plots and a combined plot are illustrated in FIG. 13. The inventors have observed that the temperature stability is largely determined by the input buffer (e.g., input buffer 402).

Figure 14:
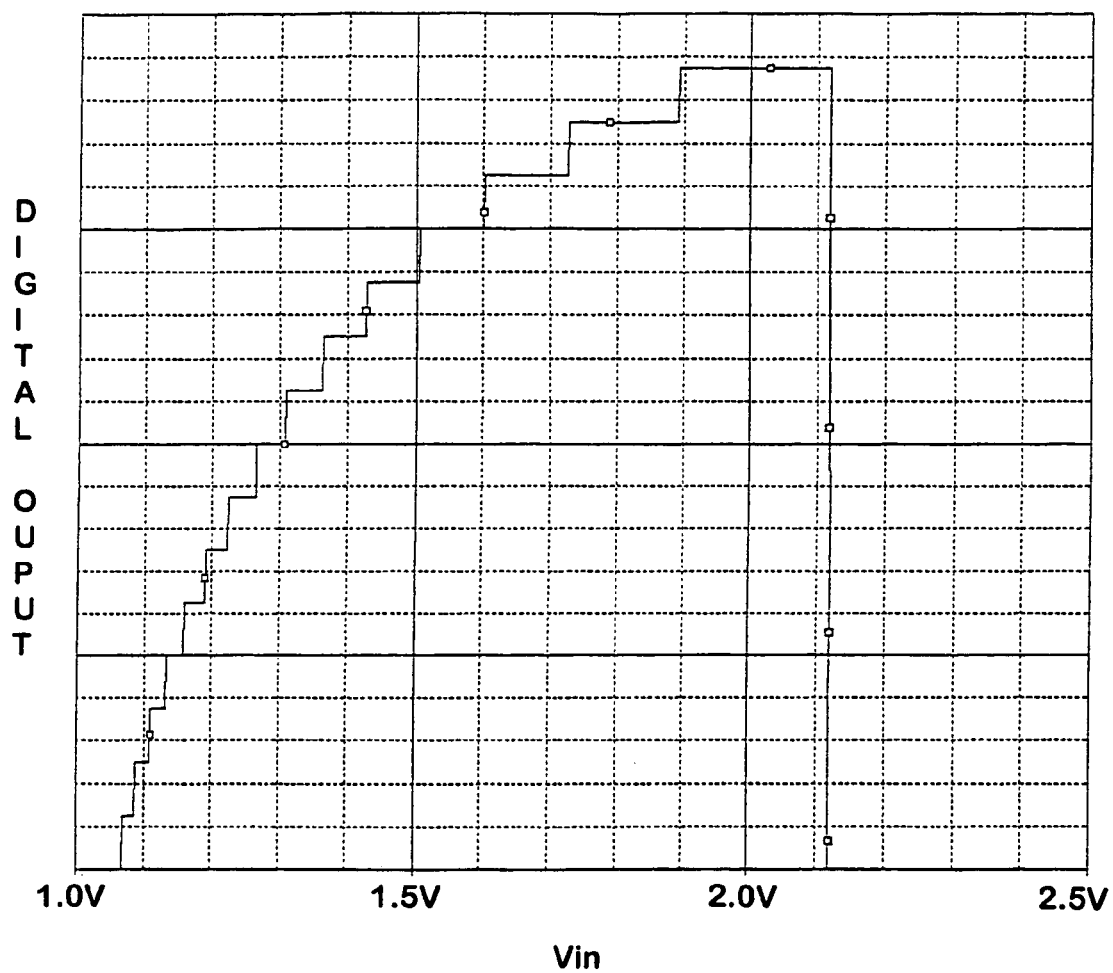
FIG. 14 is a graph showing the digital output of the A/D converter shown in FIG. 4.
Figure 15:
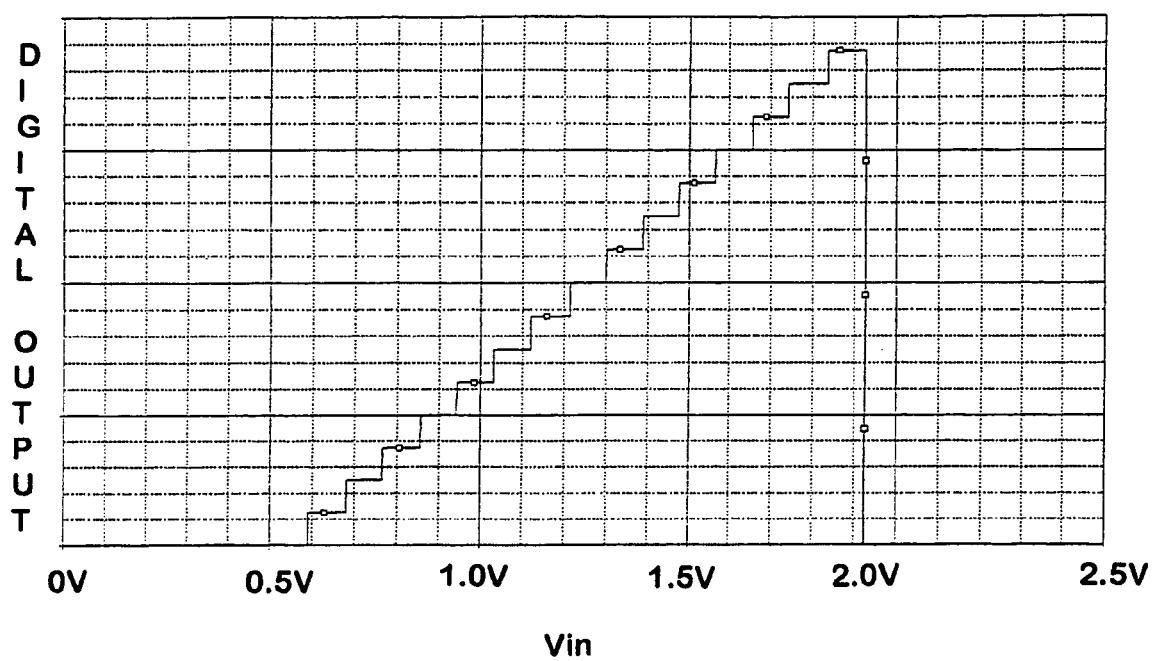
FIG. 15 is a graph showing the digital output of a linear design of the A/D converter of FIG. 4 and using the values listed in Table 1.
Figure 16:
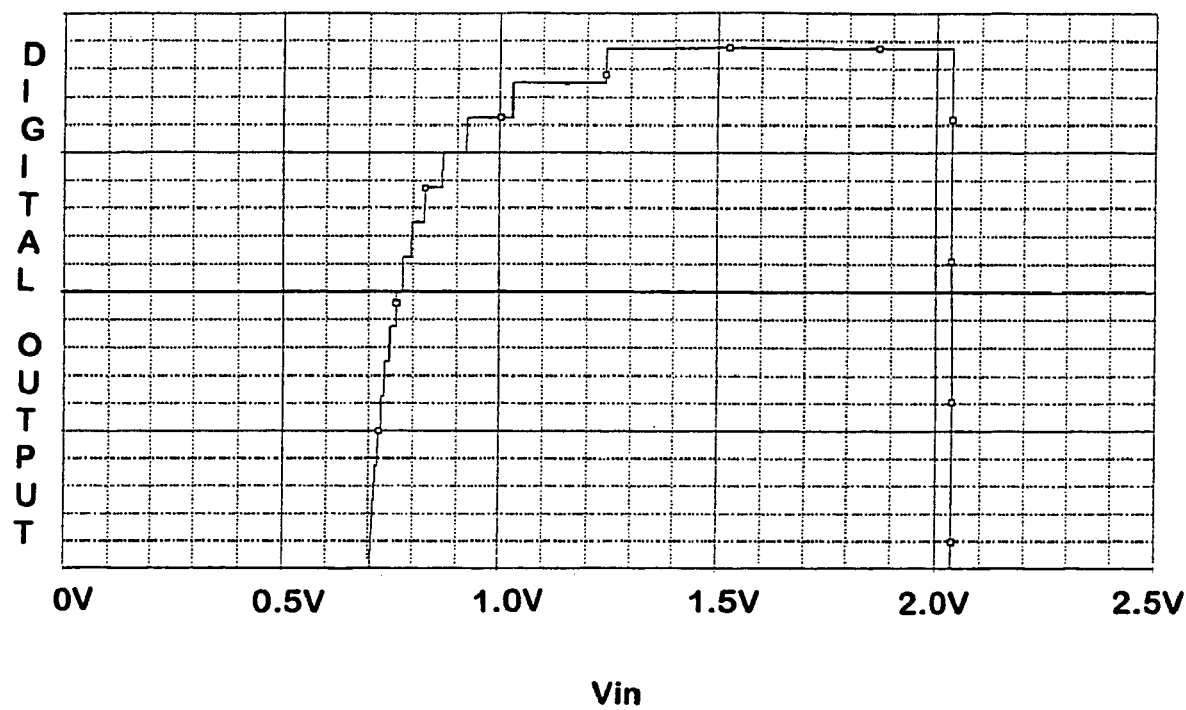
FIG. 16 is a graph showing the digital output of a logarithm-like design of the A/D converter of FIG. 4 and using the values listed in Table 1.

FIG. 14 is a graph illustrating the digital output of the ADC device 304 shown in FIG. 4. The inventors measured the digital output using less compression by adding a 4R resistor at the end of the resistor chain 404 and ground with a 300 mV VSW.

Topological Characteristics

Signal Multiplication

Although signal multiplication can be achieved using a standard Flash converter, such requires $V_{ref}$ to be changed to $V_{DD}$. If the Vsw is multiplied by a factor of β as in (4), the digital output of the ADC 304 (FIG. 4) actually looks as if the analog input were multiplied by 1/β as in equation (5) shown below. This would be useful if integrated with the variable $V_{sw}$, since the transfer function can be changed after design. One skilled in the art would appreciate that no increase in the actual signal occurs and that only a change in the digital output is taking place.

$$1 - \frac{\beta * V_{sw}}{V_{in}} = \frac{n}{N} \quad (5)$$

$$1 - \frac{V_{sw}}{\left(\frac{1}{\beta}\right)V_{in}} = \frac{n}{N} \quad (6)$$

where $V_{sw}$=switching voltage of a comparator n=number of the comparator among the plurality of comparators $V_n$=voltage applied to a corresponding comparator N=number of bits prior to the encoder LSB and Linearization An input voltage difference $\Delta V_{in}$ causes a change in state in the range between any 2 comparators, k and m, given that there is a constant reference switching voltage $V_{sw}$, is found from equation (2) as shown above:

$$\Delta V_{km} = \frac{2^N(m-k)}{(2^N-k)(2^N-m)} \quad (7)$$

The LSB is found when k=0 and m=1, and the range as a function of the switching voltage from equation (2) by letting n=$2^N$−1, as given by $$V_{LSB} \approx \frac{V_{sw}}{2^N} \approx \frac{V_{range}}{2^{2N}} \quad (8)$$

This can be compared to a flash LSB, $$V_{LSB} = \frac{V_{range}}{2^N} \quad (9)$$

As can be seen from above, a 4-bit compressing converter (e.g., ADC 304) can have same LSB resolution as an 8-bit flash converter. This factor determines the operational voltage design constraints set on the comparator (e.g., comparators 406).

The output function of the ADC 304 can be linear when $V_{in} < 2*V_{sw}$. Accordingly, for small signals the ADC 304 acts as a normal A/D converter. For signals greater than $2*V_{sw}$, the output begins to take on a nonlinear characteristic. This increases the voltage difference between each digital word and allows for large signals to be detected and processed. Therefore, the ADC 304 can have a large dynamic range.

Supply Rails

The compressing converter (e.g., ADC 304) requires higher supply rails to increase the bit resolution. The required voltage is about $V_{max} = 2^N \times V_{sw}$. The maximum voltage for a conventional Flash converter is $V_{max} = 2^N \times V_{bit}$. Since the maximum voltages are comparable, it can be seen that the $V_{LSB}$ governs the supply rail.

In some embodiments, the range of the ADC 304 can be expanded by using two power supplies, while still minimizing power consumption. Specifically, a higher analog supply rail can be used for the buffer (e.g., buffer 402) and resistive ladder (e.g., resistor chain 404), increasing the range, and a lower digital rail could be used to minimize the power consumption. Such technique can maintain the low power consumption of the digital encoder (e.g., encoder 408) and comparators (e.g., comparators 406), while allowing for a larger range.

Simple and Arbitrary Compressing Functions

Although only the inverse-V (−1/Vin) compressing function has been described above, it will be appreciated that any monotonically increasing compressing function can be used. The monotonically increasing result can be relaxed if the designer is willing to modify the encoder. The inverse-V compressing function can be modified by adding fixed resistors to either end of the resistor chain (e.g., resistor chain 404 (FIG. 4)). A resistor connected between the resistive ladder (e.g., resistor chain 404) and ground reduces the compression of the device (e.g., device 304), while a resistor between the buffer (e.g., input buffer 402) and the resistor chain increases the compression.

An arbitrary compressing function can be designed in a straightforward way. A plot of the function is first generated. The output voltages are divided evenly with $2^N-1$ lines and the differences between the input voltages at these values are calculated. A given arbitrary switch can occur when equation (10) as presented below is true. Using equation (10) and the differences in the input voltage, the resistor values of the resistor chain (e.g., resistor chain 404) can be found through an iterative process beginning with the resistor, among the resistors of the resistor chain 404 for example, nearest to ground. The $V_{MSB}$ as well as the total resistance may have to be provided. Through this method, other useful compressing functions are made possible.

$$V_{in} \times \frac{\sum R_{Below}}{R_{total}} = V_{SW} \quad (10)$$

The resistive ladder (e.g., resistor chain 404) of the compressing ADC 304 can be modified to achieve other functions, however due to the practical limitations of IC resistor design, such other compressing functions can be difficult.

To demonstrate the design flexibility, a linear design (FIG. 15) and a logarithm-like design (FIG. 16) were simulated. The designs show that only compressing functions can be practical and that small variations in the design can lead to many different compressing functions. The resistor values and $V_{sw}$ are listed in Table 1.

TABLE 1

| Device | function | | |
|---|---|---|---|
| | $-1/V_{in}$ | $aV_{in}$ | $\log(V_{in})$ |
| R1 | 1000 | 120K | 500 |
| R2 | 1000 | 32K | 500 |
| R3 | 1000 | 13.4K | 600 |
| R4 | 1000 | 6400 | 600 |
| R5 | 1000 | 3600 | 700 |
| R6 | 1000 | 2300 | 700 |
| R7 | 1000 | 1700 | 800 |
| R8 | 1000 | 1120 | 800 |
| R9 | 1000 | 890 | 1000 |
| R10 | 1000 | 710 | 1000 |
| R11 | 1000 | 590 | 1000 |
| R12 | 1000 | 500 | 1000 |
| R13 | 1000 | 390 | 1100 |
| R14 | 1000 | 360 | 1100 |
| R15 | 1000 | 300 | 1100 |
| R16 | 1000 | 4000 | 800 |
| VSW (mV) | 50 | 30 | 80 |

Aspects of the invention provide various advantages, which in some embodiments include an ability to provide high precision on the least significant bits of the A/D converter 304. The transfer function of the A/D converter is robust against resistor variations that can arise in manufacturing. Small changes in the large resistors have no real affect on the transfer function of the A/D converter 304. The design according to various aspects allows precision in the lower bits at the possible trade off of decreased robustness in the higher bits and larger resistor values. Such precision in the lower bits may be useful in specific applications, examples of which include radar, sonar, etc.

The topology presented in accordance with various aspects is an advancement for System-on-Chip designs, the design implements arbitrary compressing functions thereby eliminating additional processing steps in the signal processing chain. This allows the optimization of sensor systems and natural companding. The design topology was demonstrated in a SPICE simulation using an all CMOS design and results matched the theoretical results. In various embodiments, the topology of the ADC 304 allows the use of fixed threshold comparators for simple designs and has a very low quiescent power.

The topology presented in accordance with various aspects generates arbitrary compressing transfer functions. Various embodiments of the invention can be implemented in CMOS. Other advantages over prior art include use of Fixed Threshold Comparators (FTCs), a very low quiescent power, and simple signal multiplication. Overall, the power dissipation has the potential to be much lower than conventional flash converters, since the resistor chain can be "turned off". Moreover, since the ADC device (e.g., device 304) needs fewer bits, and thus a smaller encoder circuit, to cover the dynamic range with a comparable small signal resolution (e.g., as for AC coupled signals). Low bit counts result in a lower overall power consumption. The topology presented in accordance with various aspects can be used in system-on-chip designs, and other sample applications of the topology include low power sensor networks.

In addition to the small sensor arrays, the device in accordance with various embodiments has applications in radar, sonar, communications, and general signal processing. The general signal processing applications include, for example, companding, compression, and expansion. Expansion can be performed in analog or digital modes. Additional applications include, for example, instrumentation amplifiers, and optical meters. Other advantages of the various aspects of the invention include integration of compression and digitization of an analog signal, signal compression with low quiescent power operation, a compressing converter with a linear region over $2^N-1$ LSBs, an N-bit design with the LSB resolution and total range of a 2N-bit design, a design featuring an output function with flexibility in regions of operation, a design enabling use of single threshold comparators for maximum optimization, a design featuring a fixed load resistance as seen by the input allowing independent optimization of the input buffering stage.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of converting an analog signal to a digital signal, comprising:
   receiving an analog input signal;
   compressing the analog input signal; and
   converting the compressed analog input signal to a digital signal, wherein the compressing and the converting are simultaneously performed in a single step,
   said receiving, compressing, and converting are accomplished in an N-bit analog-to-digital converter circuit having an isolation circuit, an input circuit including a resistor chain, a plurality of fixed threshold comparators, and an encoder,
   the isolation circuit configured to isolate a device supplying the analog input signal from the input circuit, the isolation circuit being connected to the input circuit at an uppermost node of the resistor chain,
   wherein $2^N$ values of the analog input signal are connected to inputs of the fixed threshold comparators to produce corresponding output signals,
   wherein the input circuit has a compressing transfer function achieved by varying the resistance from rung to rung in the resistor chain.

2. The method of claim 1, wherein the compressing approximates a logarithmic-like function of the analog input signal relative to an adjustable reference voltage.

3. The method of claim 1, wherein the compressing is performed using a compressing converter having a linear region over $2^{N-1}$ LSB.

4. The method of claim 1, wherein the converting is performed in an all CMOS implementation.

5. The method of claim 1, wherein the converting is performed in a bipolar implementation.

6. The method of claim 1, wherein the receiving comprises receiving the analog input signal via an isolation circuit, the isolation circuit comprising a buffer.

7. An N-bit analog to digital converter circuit comprising:
   an isolation circuit;
   an input circuit including a resistor chain having a plurality of resistors connected in series,
   a plurality of fixed threshold comparators; and
   an encoder,
   the isolation circuit configured to isolate a device supplying the analog input signal from the input circuit, the isolation circuit being connected to the input circuit at an uppermost node of the resistor chain;
   wherein $2^N$ values of the analog input signal are connected to inputs of the fixed threshold comparators to produce corresponding output signals,
   wherein the input circuit has a compressing transfer function achieved by varying the resistance from rung to rung in the resistor chain, and
   compression of the analog input signal and conversion of the compressed analog input signal to a digital representation are simultaneously performed in a single step.

8. The analog to digital converter of claim 7, wherein the isolation circuit comprises a buffer, the buffer comprises a common drain amplifier.

9. The analog to digital converter of claim 7, wherein the isolation circuit comprises a buffer, and presenting the analog input signal through the buffer provides increased drive current to the resistor chain and isolates the device supplying the analog input signal thereby minimizing loading of the device.

10. The analog to digital converter of claim 7, wherein the resistor chain includes a first end and a second end, the first end being coupled to an output end of the isolation circuit, and the second end being connected to one of a ground or an arbitrary voltage source (v−), thereby causing nodes of the resistor chain to be a constant fraction of the analog input signal.

11. The analog to digital converter of claim 10, wherein node voltages of the resistor chain are evenly spaced and the resistor chain is configured with equal value resistances.

12. The analog to digital converter of claim 7, wherein the nodes of the resistor chain are connected to the inputs of the fixed threshold comparators.

13. The analog to digital converter of claim 7, wherein the analog to digital converter is non-linear and performs amplification of the analog input signal before converting it to a digital signal.

14. An N-bit analog to digital converter circuit comprising:
   an isolation circuit;
   an input circuit including a resistor chain including a plurality of resistors connected in series;
   a plurality of fixed threshold comparators; and
   an encoder, the isolation circuit configured to isolate a device supplying the analog input signal from the input circuit, the isolation circuit being connected to the input circuit at an uppermost node of the resistor chain,
   wherein $2^N$ values of the analog input signal are connected to inputs of the fixed threshold comparators to produce corresponding output signal,
   wherein the fixed threshold comparators comprise differential amplifiers and CMOS inverters.

15. The analog to digital converter of claim 14, wherein the fixed threshold comparators allow for increased optimization of the comparators for a given operating voltage.

16. The analog to digital converter of claim 7, wherein the encoder is configured to receive the output signals to produce digitally encoded outputs corresponding to the output signals.

17. An N-bit analog to digital converter circuit comprising:
- an isolation circuit;
- an input circuit including a resistor chain including a plurality of resistors connected in series;
- a plurality of fixed threshold comparators; and
- an encoder,
- the isolation circuit configured to isolate a device supplying the analog input signal from the input circuit,
- the isolation circuit being connected to the input circuit at an uppermost node of the resistor chain,
- wherein $2^N$ values of the analog input signal are connected to inputs of the fixed threshold comparators to produce corresponding output signal,
- wherein the compression is performed using a converter having a linear region over $2^{N-1}$ LSB.

18. The analog to digital converter of claim 17, wherein compression of the analog input signal approximates a logarithmic-like function relative to an adjustable reference voltage.

19. The analog to digital converter of claim 7, wherein the analog to digital converter includes CMOS devices.

20. The analog to digital converter of claim 7, wherein the analog to digital converter includes bipolar devices.

* * * * *